United States Patent [19]
Hunt

[11] Patent Number: 4,551,706
[45] Date of Patent: Nov. 5, 1985

[54] APPARATUS FOR DECODING RUN-LENGTH ENCODED DATA

[75] Inventor: David J. Hunt, Hitchin, United Kingdom

[73] Assignee: International Computers Limited, London, England

[21] Appl. No.: 606,382

[22] Filed: May 2, 1984

[30] Foreign Application Priority Data

May 14, 1983 [GB] United Kingdom ............... 8313331

[51] Int. Cl.⁴ .............................................. G08C 9/00
[52] U.S. Cl. ............................................. 340/347 DD
[58] Field of Search .................................. 340/347 DD

[56] References Cited

U.S. PATENT DOCUMENTS

4,121,259 10/1978 Preuss et al. ................. 340/347 DD
4,152,697 5/1985 Rider et al. .................. 340/347 DD

FOREIGN PATENT DOCUMENTS

2080584 2/1982 United Kingdom ........ 340/347 DD

Primary Examiner—William M. Shoop, Jr.
Assistant Examiner—Sharon Logan
Attorney, Agent, or Firm—Lee, Smith & Zickert

[57] ABSTRACT

A run-length decoder arranged to produce output signals in groups, each group being output in parallel. The decoder includes a position register which indicates the position, within a group, of the latest transition between signal values. The contents of this register are added to the incoming run-length code so as to calculate the number of groups to be output before the next transition and the position within the group of that next transition. The calculated number of groups is then output and a transition is introduced into the calculated position in the next group to be output.

9 Claims, 5 Drawing Figures

APPARATUS FOR DECODING RUN-LENGTH ENCODED DATA

This invention relates to apparatus for decoding run-length encoded data.

In a run-length encoding scheme, the data to be encoded is divided into runs, i.e. strings of signals of the same value, and each run is represented by a run-length code indicating the number of signals in the run. For example, the signals may be binary digits (bits), in which case the run-length code represents the number of binary ones or zeroes in the run.

Run-length coding is often used, for example, to encode digitised image data, representing text or graphics. Such data is typically characterised by long run lengths between transitions, and hence run-length coding can result in a significant compression in the number of signals required to represent an image. This compression leads to corresponding savings in storage space and/or transmission time for the data.

The conventional way of decoding a run-length encoded signal is to load the run-length code into a counter, and then to count down to zero, outputting a signal of the required value at each count. When the counter reaches zero, a transition is made to another signal value, the counter is loaded with the next run-length code, and the process is repeated.

In order to produce a high quality (high resolution) display in real time, it is necessary to feed the data to the display unit (e.g. a raster-scanned cathode-ray tube screen) at a very high rate. The run-length decoder must therefore be able to decode the data at a high rate. This requires the use of fast, and hence expensive, circuits. In particular, a conventional run-length decoder would require a counter capable of counting at the picture-element rate of the display.

British Patent Specification No. 1,598,343 describes a run-length decoding arrangement in which groups of N signals are output in parallel, so reducing the required rate of operation of the decoding circuits by a factor of N. However, in that specification, special codes referred to as transition codes are required, in addition to the normal run-length codes, to specify the contents of the groups in which the transitions occur.

The object of the present invention is to provide a run-length decoding apparatus in which the required rate of operation is reduced without the need for special transition codes.

SUMMARY OF THE INVENTION

According to the invention there is provided apparatus for decoding run-length encoded data comprising:
(a) an input for receiving a succession of run-length codes each of which represents the length of a run of signals of the same value,
(b) an output for outputting a succession of groups of signals, each group containing a predetermined number n of signals which are output in parallel,
(c) a position register for storing an indication of the position, within a group of signals, of the latest transition between signal values,
(d) calculation means for using the contents of the position register and the received run-length code to calculate the number x of groups to be output before the next transition, and the position within the group of that next transition, and
(e) logic means for producing the transition at the calculated position after the calculated number x of groups have been output.

It can be seen that the invention requires only normal run-length codes as input, and does not need special transition codes to indicate the positions of the transitions within the output groups.

One particular embodiment of the invention will now be described by way of example with reference to the accompanying drawings. In this embodiment, the data is binary, and is output as a succession of 8-bit bytes i.e. n=8.

DESCRIPTION OF THE EMBODIMENT OF THE INVENTION

Overall system

Figure 1:
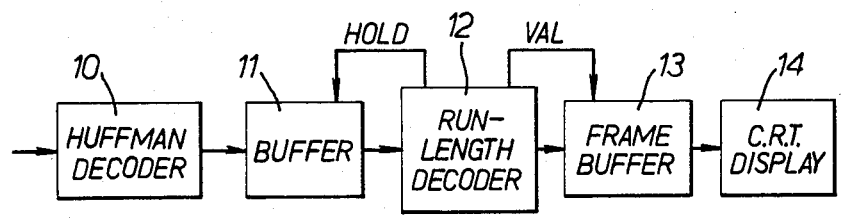
FIG. 1 is a block diagram of a digitised image display system which includes a run-length decoder in accordance with the invention.

Referring to FIG. 1, this shows a graphics display system for receiving encoded image data. The input data may, for example, come from a storage device, or may be received from a transmission channel.

The input data is doubly encoded: first by means of a run-length code, and secondly by means of a Huffmann coding scheme. Huffmann coding is well known in the art and forms no part of the present invention, and so will not be described herein.

The input data is first decoded by means of a Huffmann decoder circuit 10 and the resulting run-length encoded data is placed in a first-in-first-out buffer 11. The output of the buffer 11 is fed to a run-length decoder 12 in accordance with the invention. The run-length decoder 12 produces a control signal HOLD for the buffer 11; when HOLD is high (i.e. HOLD=1) it causes the buffer 11 to hold its output static, and when HOLD is low (HOLD=0) it allows the buffer to step forward to its next output.

The decoded output from the run-length decoder 12 is fed to a frame buffer 13 along with a control signal VAL which indicates whether or not the output from the decoder 12 is valid. When VAL=1, the output is accepted by the frame buffer 13. The frame buffer holds a complete frame of image data, for output to a raster-scanned CRT display 14.

Run-length coding scheme

The run-length coding scheme uses codewords of two different types: terminal codewords and make-up codewords. Each codeword has seven bits, the first bit being a control bit MUC which indicates whether this is a terminal codeword (MUC=0) or a make-up codeword (MUC=1). The other six bits form a length code LEN.

Short run lengths, up to 63 bits, are encoded by a single terminal codeword, with a length code equal to the number of bits in the run. Longer run lengths (64 bits or more) are represented by a make-up codeword followed by a terminal codeword. The make-up codeword represents a run length in multiples of 64 bits, while the terminal codeword represents the remainder (possibly zero). It should be noted that a make-up codeword is always followed by a terminal codeword, and cannot terminate a run.

Thus, for example, a run length of 201 bits would be represented by the make-up codeword 1.000011 (3×64 bits) followed by the terminal codeword 0.001001 (9 bits).

Run-length decoder

Figure 2:
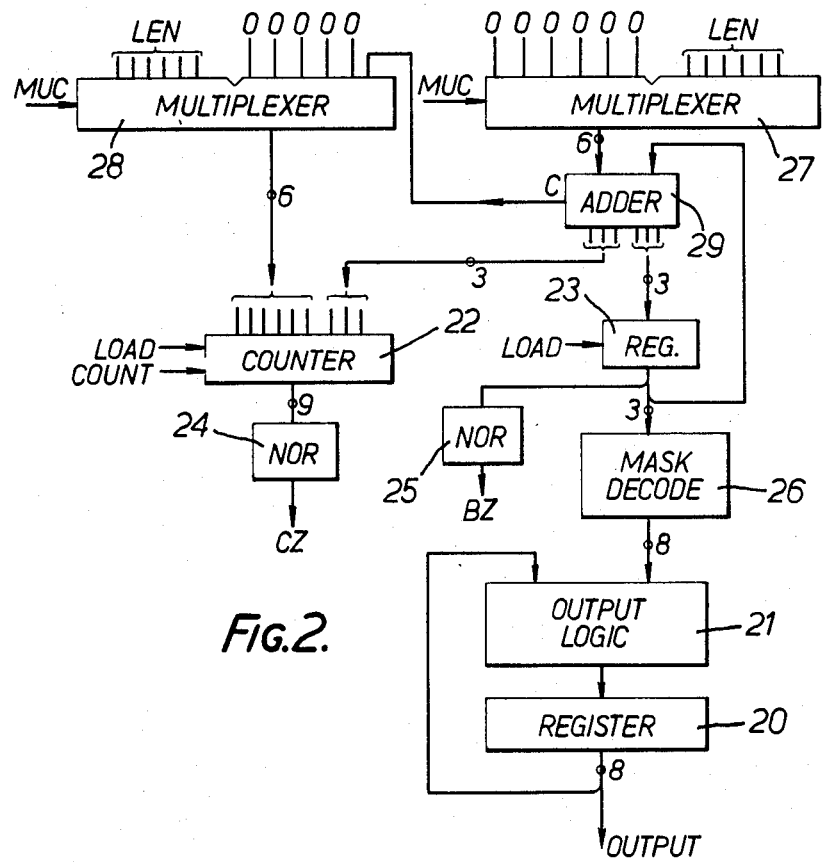
FIG. 2 is a logic circuit diagram of the run-length decoder.

Referring to FIG. 2, this shows the run-length decoder 12 in detail.

The run-length decoder contains an output register 20 which holds an 8-bit byte. This register is loaded at every beat of a 10 MHz clock signal CLK with a byte from an output logic circuit 21. If the control signal VAL is true, the byte is then output at the next clock beat to the frame buffer 13. The output logic circuit 21 is described in detail below with reference to FIG. 3.

The run-length decoder also includes a nine-stage counter 22 which holds the number of bytes to be output from the register 20 before the next transition. A register 23, referred to as the bit position register, holds a 3-bit code representing the bit position within the byte at which the next transition will occur. For example, if the bit position register 23 holds the code 011 (decimal 3) this indicates that the next transition will occur after the third bit of the byte in question.

All the stages of the counter 22 are connected to a NOR gate 24 producing a control signal CZ; CZ=1 indicates that the contents of the counter are all zero. This signal is inverted to produce the HOLD and VAL signals to the buffers 11 and 13 (FIG. 1) mentioned above.

The contents of the bit position register 23 are fed to a NOR gate 25 to produce a control signal BZ. Thus, BZ=1 indicates that the contents of the register 23 equal zero, i.e. that the next transition will occur at the boundary between two bytes. The output of the register 23 is also fed to a decoder circuit 26 which produces an 8-bit mask pattern of zeroes and ones, with a transition at the bit position indicated by the contents of the register 23. The output of the decoder circuit is shown in the Table 1 below.

TABLE 1

| Register 23 | Mask pattern |
|---|---|
| 000 | 11111111 |
| 001 | 01111111 |
| 010 | 00111111 |
| 011 | 00011111 |
| 100 | 00001111 |
| 101 | 00000111 |
| 110 | 00000011 |
| 111 | 00000001 |

The decoder circuit 26 is described in detail below with reference to FIG. 5.

In operation, the counter 22 is normally decremented by one at each beat of the clock CLK, by means of a control signal COUNT. However, when the counter reaches zero, the next COUNT signal is suppressed and a LOAD signal is produced instead. This causes new values to be loaded into the counter 22 and the register 23. These new values are derived from the input codeword by means of multiplexers 27,28 and a 6-stage adder 29.

The multiplexers are both controlled by the control bit MUC of the input codeword. When MUC=0, the multiplexer 27 selects the currently input length code LEN and multiplexer 28 selects a six bit input of which the five most significant bits are all wired to a voltage representing zero, and the sixth bit is connected to the carry output C of the adder 29. When MUC=1, the multiplexer 27 selects a six bit input, all zero, and the multiplexer 28 selects the length code LEN.

The output of the multiplexer 27 is fed to one input of the adder 29, the other input of which receives the output of the bit position register 23. The three least significant bits of the adder output are fed to the register 23, while the three most significant bits go to the three least significant stages of the counter 22. The output of the multiplexer 28 is fed to the six most significant stages of the counter 22.

Thus, if the input codeword is a terminal codeword (MUC=0), the length code LEN is added to the existing contents of the register 23. Then, at the next LOAD signal, the three least significant bits of the result are written into the register 23, and the four most significant bits (including the carry bit C) are written into the counter 22. If the input codeword is a make-up codeword (MUC=1) the length code LEN is effectively left-shifted by six places (i.e. multiplied by 64) by the multiplexer 28 before being written into the counter, and in this case the contents of the register 23 are unaltered.

It can be seen that the multiplexers 27,28 and the adder 29 use the input codeword to calculate (a) the number of bytes to be output before the next transition and (b) the bit position within the byte at which the transition will occur.

At the LOAD signal, the calculated number of bytes is loaded into the counter 22 and the calculated bit position is loaded into the register 23.

For example, suppose the bit position register 23 holds the value 011. Suppose now that the next input codeword is 0.101011 i.e. it is a terminal codeword representing a run length of 43 bits. The adder 29 will therefore perform the addition.

$$+ \frac{\begin{array}{r}101011\\011\end{array}}{101110}$$

At the LOAD signal, the first three bits of the result (101) are loaded into the counter, indicating that there are five bytes to be output before the next transition. At the same time the last three bits (110) are loaded into the register 23, indicating that the transition will be after the sixth bit of the byte.

Output logic circuit

Figure 3:
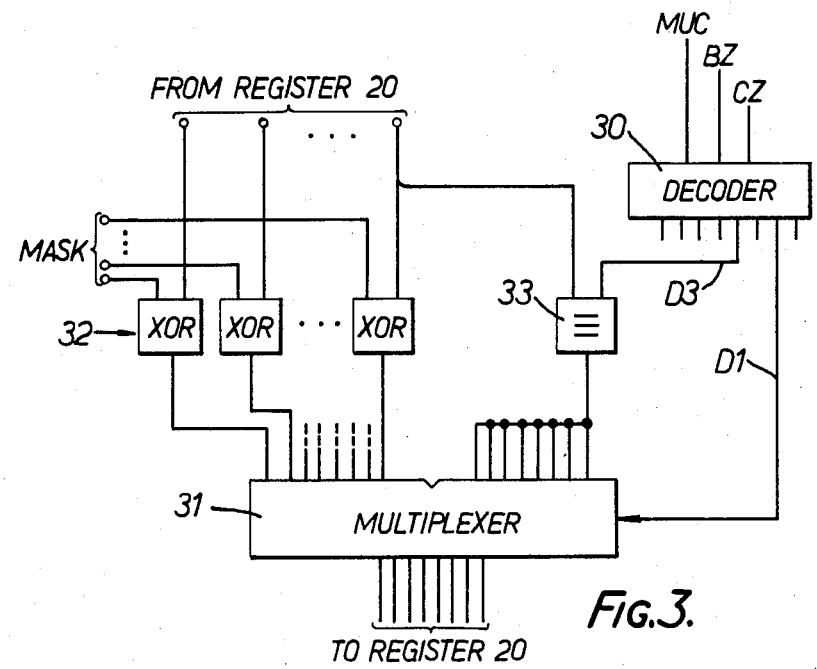
FIG. 3 is a logic circuit diagram of an output logic unit forming part of the run-length decoder.

Referring now to FIG. 3, this shows the output logic circuit 21 in detail.

The circuit includes a conventional 3:8 decoder 30 which is controlled by the three signals MUC, BZ and CZ mentioned above. Only two of the outputs D1 and D3 of this decoder are used. Both these outputs are normally high, representing binary one. D1 goes low if MUC=0, BZ=0 and CZ=1, while D3 goes low if MUC=0, BZ=1 and CZ=1.

The signal D1 controls a 2:1 multiplexer 31; when D1=0, the multiplexer 31 selects a first set of eight inputs which are connected to eight exclusive −OR gates 32, and when D1=1 it selects a second set of inputs which are connected to the output of a single equivalence gate 33.

The exclusive −OR gates 32 each have two inputs. The right-hand inputs are connected to respective bits of the output register 20; while the left-hand inputs receive the 8-bit mask pattern from the mask decoder 26 (FIG. 2).

The equivalence gate 33 has two inputs which receive the least significant bit of the output register 20 and the signal D3 from the decoder 30.

The output of the multiplexer 31 is the output of the logic circuit 21, and is fed to the output register 20. It can be seen that this output depends on the states of the control signals MUC, BZ and CZ, and also on the existing contents of the output register, as follows.

(1) If CZ=0 or if MUC=1, both D1 and D3 are high, and so the multiplexer 31 selects the output of the equivalence gate 33 which in this case is equal to the least significant bit of the output register 20. Hence, the output register 20 is loaded with a byte whose bits are all equal to the least significant bit of its current contents.

(2) If MUC=0, BZ=1 and CZ=1, then the signal D3 goes low. This causes the equivalence gate 33 to invert the bit from the output register. Hence, in this case, the output register 20 is loaded with a byte whose bits are all equal to the inverse of the least significant bit of its current contents.

(3) If MUC=0, BZ=0 and CZ=1, then the signal D1 goes low. This causes the multiplexer 31 to select the outputs of the exclusive −OR gates 32. Thus, the output register is loaded with a byte formed by a bit-by-bit exclusive −OR of the current contents of the output register with the mask pattern from the decoder circuit 26 (as specified in Table 1 above). The effect of this is to invert all the bits of the output register following the bit position indicated by the register 23.

For example, if the output register 20 contains all ones, and the bit position register 23 holds the value 011 (decimal 3), then the exclusive −OR is as follows:

| output register | 1111 1111 |
|---|---|
| mask pattern | 0001 1111 |
| exclusive −OR | 1110 0000 |

It can be seen that all the bits after the third are inverted.

Operation

Figure 4:
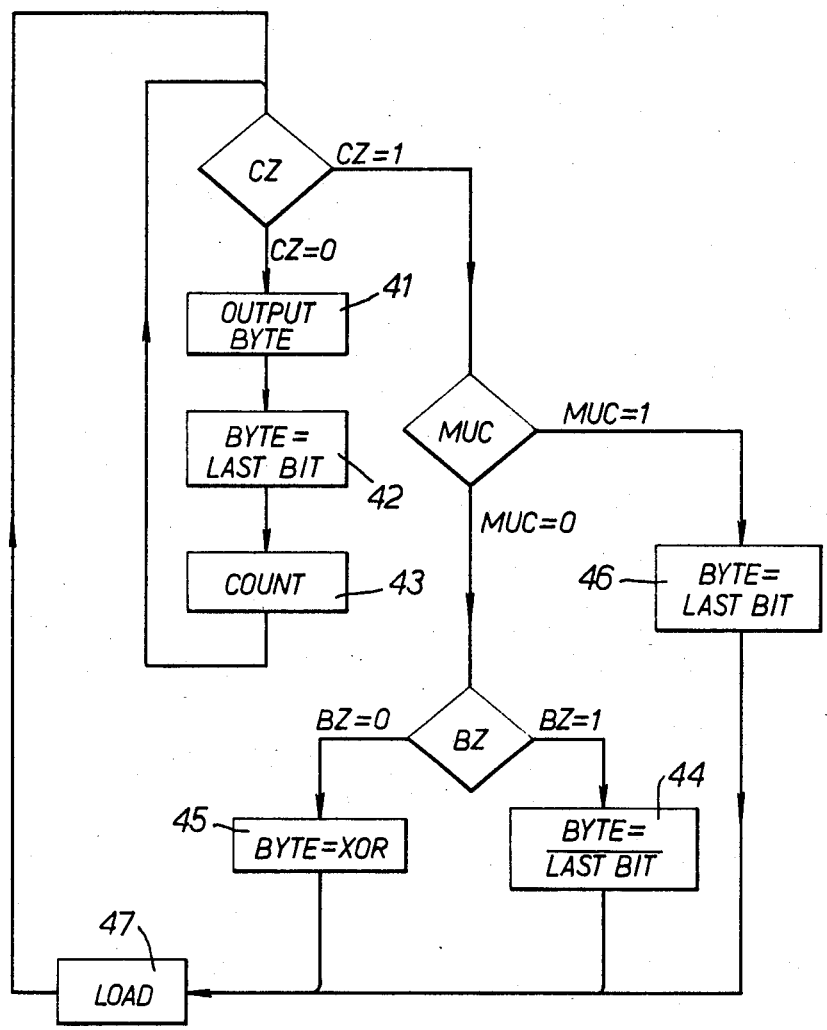
FIG. 4 is a flow chart illustrating the operation of the run-length decoder.

The operation of the run-length decoder 12 will now be described with reference to the flow chart of FIG. 4. In this figure, the diamond-shaped boxes represent control decisions, according to the values of the control signals MUC, BZ and CZ, while the rectangular boxes represent operations.

Box 41: If the counter has not yet reached zero (CZ=0) the VAL signal is high and so the current contents of the output register 20 are output to the frame buffer at the next clock beat.

Box 42: The output register is then loaded with a new byte from the output logic 21. Since CZ=0, this new byte has all its bits equal to the last (least significant) bit of the current byte.

Box 43: At the same time, the counter 22 is decremented by one, by the COUNT signal. This loop (boxes 41–43) is repeated at each clock beat until the counter 22 reaches zero.

Box 44: When the counter reaches zero (CZ=1), if the current codeword is a terminal codeword (MUC=0) and if the next transition is at the boundary of the present byte and the next (BZ=1), then the output register 20 is loaded with a byte whose bits are all equal to the inverse of the last bit of the current byte.

Box 45: If, on the other hand, the transition is within the next byte (BZ=0), the output register 20 is loaded with the exclusive −OR of the current contents and the mask pattern from the decoder 26. This produces a byte with a transition in the required position.

Box 46: If the current codeword is a make-up codeword (MUC=1) the end of the run has not yet been reached, since, as mentioned previously, a make-up codeword must always be followed by a terminal codeword. Hence, in this case, the output register is loaded with a byte whose bits are all equal to the last bit of the current byte.

Box 47: Since the counter has now reached zero, a LOAD signal is produced. This causes the byte and bit positions of the next transition to be loaded into the counter 22 and bit position register 23 respectively.

The sequence is then repeated.

It should be noted that the system described is able to handle situations where more than one transition occurs within the same byte. In this case, the counter 22 remains at zero for more than one clock beat. At each of those clock beats, the contents of the output register 20 are exclusively −ORed with the mask pattern from the decoder 26 (Box 45) to produce another transition in the byte. During this time, no bytes are output from the register 20 since the counter 22 is at zero. Eventually, a length code is received which causes the counter 22 to be set to a non-zero value, whereupon the byte containing the multiple transitions is output (box 41).

Mask pattern decoder

Figure 5:
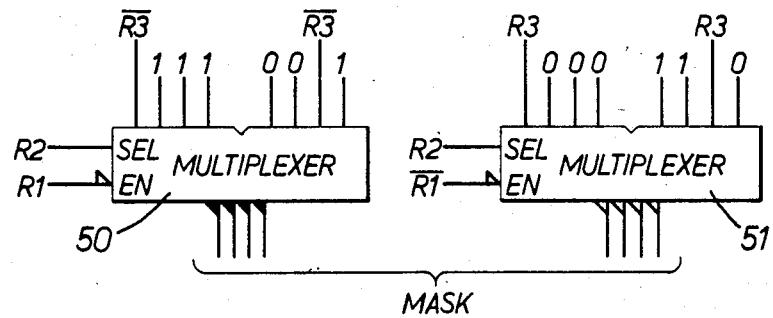
FIG. 5 is a logic circuit diagram of a mask pattern decoder forming part of the run-length decoder.

Referring to FIG. 5, this shows the mask pattern decoder 26 in detail.

The decoder is constructed from two 2:1 multiplexers 50,51. Multiplexer 50 supplies the four most significant bits of the mask pattern, while the (inverted) output of multiplexer 51 supplies the four least significant bits.

The output of the bit position register 23 is shown as three bits R1, R2, R3. The most significant bit R1 controls the enabling of the multiplexers such that multiplexer 50 is enabled when R1=0 and multiplexer 51 is enabled when R1=1. The middle bit R2 is connected to the select input of both multiplexers such that when R2=0 the left-hand input is selected, and when R2=1 the right-hand input is selected.

The inputs of the two multiplexers are wired to receive patterns of high (binary 1) and low (binary 0) voltages, and the least significant bit R3 as shown. It can easily be seen by inspection of FIG. 5 that this provides the required output mask patterns as shown in Table 1.

I claim:

1. Apparatus for decoding run-length encoded data, comprising:
 (a) an input for receiving a succession of run-length codes each of which represents the length of a run of signals of the same value, (b) an output for outputting a succession of groups of signals, each group containing a predetermined number n of signals which are output in parallel, (c) a position register for storing an indication of the position, within a group of signals, of the latest transition between signal values, (d) calculation means for using the contents of the position register and the received run-length code to calculate the number x of groups to be output before the next transition, and the position within the group of that next transition, and (e) logic means for producing the transition at the calculated position after the calculated number x of groups have been output.

2. Apparatus according to claim 1 wherein the calculation means comprises an adder for adding the received run-length code to the contents of the position register to produce a result, the most significant part of which indicates the number x of groups to be output before the next transition and the least significant part of which indicates the position within the group of the next transition.

3. Apparatus according to claim 1 wherein the logic means comprises:

(a) means for producing a binary mask pattern consisting of n bits with a transition between binary values at the calculated position, and (b) means for combining the mask pattern with the latest group of signals to be output.

4. Apparatus according to claim 1 wherein said signals are binary digits.

5. Apparatus for decoding run-length encoded data, comprising:

(a) an input for receiving a succession of run-length codes each of which represents the length of a run of signals of the same value, (b) an output register for holding a group of n signals for output in parallel, (c) a position register for storing an indication of the position, within a group of signals, of the latest transition between signal values, (d) calculation means for using the contents of the position register and the received run-length code to calculate the number x of groups to be output before the next transition and the position within the group of that next transition, (e) means for outputting x groups from the output register, and (f) means operative after the x groups have been output, for introducing a transition into the output register at the position calculated by the calculation means.

6. Apparatus according to claim 5 wherein the means for outputting x groups comprises counting means for counting the number x and, at each count, outputting the contents of the output register and then setting each signal in the output register equal to the value of the last signal therein.

7. Apparatus according to claim 5, wherein the means for introducing a transition into the output register comprises:

(a) means for producing a binary mask pattern consisting of n bits with a transition betwen binary values at the calculated position, and (b) means for combining the mask pattern with the contents of the output register, the result of the combination being written back into the output register.

8. Apparatus according to claim 7 wherein the means for combining the mask pattern with the contents of the output register comprises a set of exclusive −OR gates.

9. Apparatus according to claim 5 wherein said signals are binary digits.

* * * * *